(12) United States Patent
Trotman et al.

(10) Patent No.: US 8,902,601 B2
(45) Date of Patent: Dec. 2, 2014

(54) REMOVABLE CIRCUIT CARD INSERT EXTRACTOR

(75) Inventors: Kenneth J. Trotman, Granby, CT (US); Michael Maynard, Springfield, MA (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 214 days.

(21) Appl. No.: 13/470,904

(22) Filed: May 14, 2012

(65) Prior Publication Data
US 2013/0301215 A1 Nov. 14, 2013

(51) Int. Cl.
| | |
|---|---|
| G06F 1/16 | (2006.01) |
| H05K 5/00 | (2006.01) |
| H05K 7/00 | (2006.01) |
| H05K 1/14 | (2006.01) |
| H05K 7/14 | (2006.01) |
| H05K 7/18 | (2006.01) |
| G06F 1/18 | (2006.01) |
| H05K 5/04 | (2006.01) |
| H05K 1/00 | (2006.01) |

(52) U.S. Cl.
CPC ............ *H05K 7/1402* (2013.01); *H05K 7/1401* (2013.01); *H05K 7/1404* (2013.01); *H05K 7/1405* (2013.01); *H05K 7/1417* (2013.01); *H05K 7/1418* (2013.01); *H05K 7/14* (2013.01); *H05K 7/1422* (2013.01); *H05K 7/1424* (2013.01); *H05K 7/1427* (2013.01); *G06F 1/183* (2013.01); *G06F 1/186* (2013.01); *G06F 1/185* (2013.01); *H05K 7/18* (2013.01); *H05K 5/00* (2013.01); *H05K 5/04* (2013.01); *H05K 1/00* (2013.01); *H05K 1/14* (2013.01)
USPC ................. 361/754; 361/679.38; 361/679.43; 361/679.59; 361/741; 361/752; 361/756; 361/759; 361/798; 361/801

(58) Field of Classification Search
CPC ............ H05K 1/00; H05K 1/14; H05K 5/00; H05K 5/04; H05K 7/14; H05K 7/1401; H05K 7/1402; H05K 7/1404; H05K 7/1405; H05K 7/1417; H05K 7/1418; H05K 7/1422; H05K 7/1424; H05K 7/1427; H05K 7/18; G06F 1/183; G06F 1/185; G06F 1/186
USPC ......... 361/756, 754, 759, 752, 798, 741, 801, 361/679.38, 679.43, 679.59
See application file for complete search history.

(56) References Cited

U.S. PATENT DOCUMENTS 5,140,501 A * 8/1992 Takahashi et al. ............ 361/798
5,428,507 A * 6/1995 Chatel et al. .................. 361/798

* cited by examiner

*Primary Examiner* — Anthony Haughton
*Assistant Examiner* — Zhengfu Feng
(74) *Attorney, Agent, or Firm* — Kinney & Lange, P.A.

(57) ABSTRACT

A removable tool includes a toe, a clevis, and a handle. The toe is configured to be insertable into and removable from an enclosure notch of a card guided computer enclosure. The clevis is configured to be insertable into and removable from a card hook of a circuit card assembly. The handle is for receiving force for inserting or extracting an array of circuit card assembly contacts into or out of an array of motherboard contacts, respectively.

10 Claims, 7 Drawing Sheets

REMOVABLE CIRCUIT CARD INSERT EXTRACTOR

BACKGROUND

The present invention relates to card guided computer enclosures with removable circuit card assemblies, and, more specifically, to a removable tool for inserting and/or extracting the circuit card assemblies.

Many computers include card guided computer enclosures that allow various circuit card assemblies to interface with the computer's motherboard. The interface involves a circuit card assembly with a connector mating with a corresponding connector on the motherboard. Each of these connectors have a number of contacts interfacing with a corresponding number of motherboard contacts. While the mating force between individual contacts is relatively small, the large number of contacts (for example, several hundred) means that the total force required to insert and/or extract the circuit card assembly may be quite large.

Therefore, the prior art has solved this problem by using levers that are attached to either the card guided computer enclosure or the circuit card assemblies. Because the levers are attached, each slot or card needs a set of levers and the levers remain with the computer at all times, even when the levers are not in use.

SUMMARY

According to the present invention, a removable tool includes a toe, a clevis, and a handle. The toe is configured to be insertable into and removable from an enclosure notch of a card guided computer enclosure. The clevis is configured to be insertable into and removable from a card hook of a circuit card assembly. The handle is for receiving force for inserting or extracting a circuit card assembly with an array of contacts into or out of an array of motherboard contacts, respectively.

In another embodiment, a system arrangement includes a removable tool, a card guided computer enclosure, and a circuit card assembly. The card guided computer enclosure includes an enclosure notch having a notch top and a notch bottom configured to receive the removal tool toe between the notch top and the notch bottom. The circuit card assembly includes a card hook having a hook top and a hook bottom configured to receive the removal tool clevis between the hook top and the hook bottom.

In another embodiment, a computer includes a card guided computer enclosure and a circuit card assembly positioned in the card guided computer enclosure. The card guided computer enclosure includes two enclosure notches opposite sides of the card guided computer enclosure, with each enclosure notch being configured to receive a removable tool. The circuit card assembly includes two card hooks on opposite sides of the circuit card assembly, with each card hook being configured to receive the removable tool. Each enclosure notch is adjacent to one of the card hooks.

In another embodiment, a method of inserting a circuit card assembly into a card guided computer enclosure includes positioning the circuit card assembly into the card guided computer enclosure. A toe of a removable tool is positioned into an enclosure notch on the card guided computer enclosure, and a clevis of the removable tool into a card hook on the circuit card assembly. Force is exerted on the removable tool, while maintaining the toe in the enclosure notch and the clevis in the card hook, until an array of card contacts are inserted into an array of motherboard contacts. The toe is removed from the enclosure notch and the clevis is removed from the card hook, and the removable tool is removed from the card guided computer enclosure and the circuit card assembly.

DETAILED DESCRIPTION

Figure 1A:
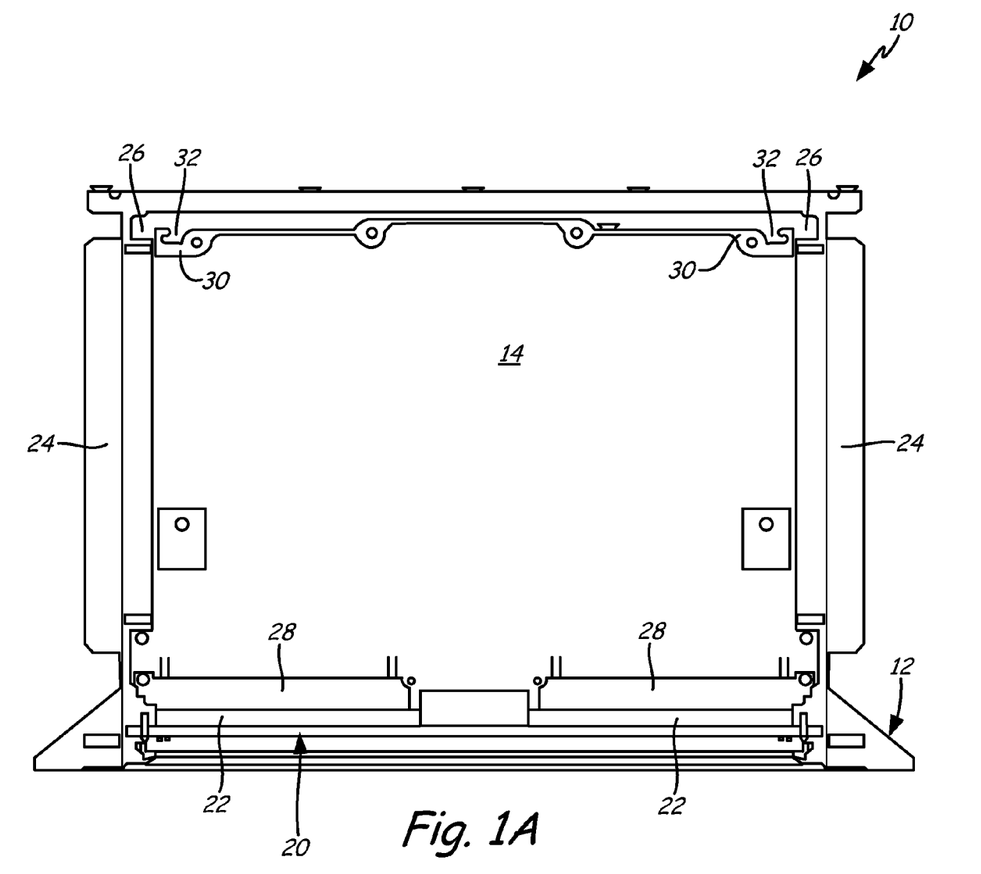
FIG. 1A is a front section view of a computer including a card guided computer enclosure and a circuit card assembly.
Figure 1B:
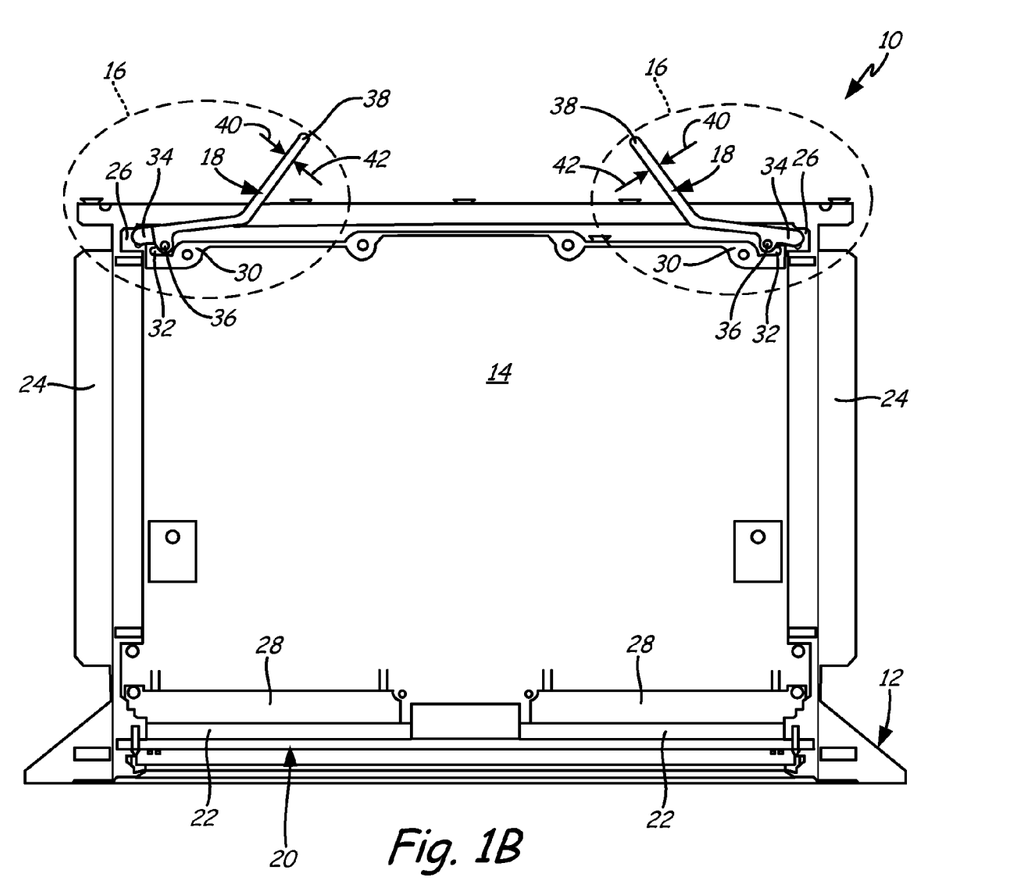
FIG. 1B is a front section view of the computer including a plurality of leverage arrangements.
Figure 1C:
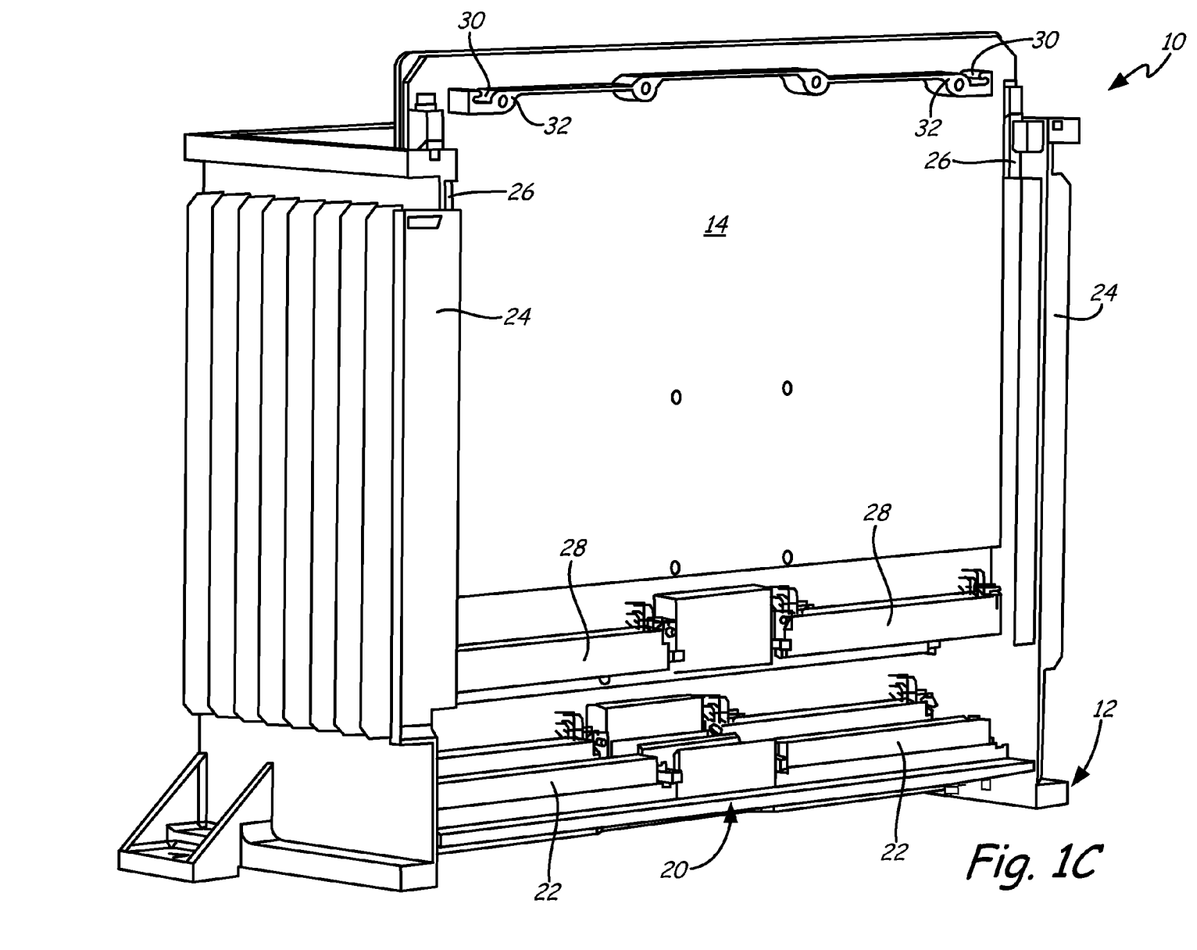
FIG. 1C is a perspective section view of the computer including an extracted circuit card assembly.

In FIG. 1A, a front view of computer 10 including card guided computer enclosure 12 and circuit card assembly 14 is shown. In FIG. 1B, a front view of card guided computer enclosure 10 including two leverage arrangements 16 is shown. In FIG. 1C, a perspective view of card guided computer enclosure 12 including an extracted circuit card assembly 14 is shown. FIGS. 1A-1C will be discussed simultaneously.

In the illustrated embodiment, computer 10 is a flight control computer for an aircraft, although computer 10 can be any type of computer that includes card guided computer enclosure 12 and at least one circuit card assembly 14. Card guided computer enclosure 12 has motherboard 20 (with motherboard connector contact arrays 22) and a plurality of card guides 24. Each card guide 24 includes enclosure notch 26. Each circuit card assembly 14 includes connector contact arrays 28 and card frame 30 (with two card hooks 32). When a circuit card assembly 14 is inserted into card guided computer enclosure 12, each enclosure notch 26 is adjacent to a card hook 32.

When a circuit card assembly 14 is inserted into card guided computer enclosure 12 and removable tool 18 is in place (as shown in FIG. 1B), there are two leverage arrangements 16. In the illustrated embodiment, each leverage arrangement 16 is at an end of card guide 24 that is distal from motherboard 20. Removable tool 18 is a lever comprising toe 34, clevis 36, and handle 38. Toe 34 is at one end of removable tool 18 and handle 38 is at the opposite end. Between these two features is clevis 36. Thereby, removable tool 18 is a class two lever, meaning that force is exerted at one end (handle 38), the fulcrum is at the opposite end (toe 34), and the resistance load is in the middle (clevis).

In order to insert circuit card assembly 14 into card guided computer enclosure 12, circuit card assembly 14 is positioned between a pair of card guides 24. Circuit card assembly 14 is slid towards motherboard 20 until card contact arrays 28 contact motherboard contact arrays 22. Then two removable tools 18 are used to insert card contact arrays 28 into motherboard contact arrays 22. This occurs for each removable tool 18 by positioning toe 34 into enclosure notch 26 and clevis 36 into card hook 32. Then force is exerted onto handle 38 along insertion direction 40 (which occurs substantially simultaneously for both removable tools 18). Because enclosure notch 26 constrains toe 34, there is a resulting force on card engagement are 32 that urges circuit card assembly 14 towards motherboard 20. If the force is sufficient, card contact arrays 28 will overcome the friction force of motherboard contact arrays 22 and circuit card assembly 14 will be inserted into card guided computer enclosure 12. Once this occurs, removable tools 18 can be removed from card guided computer enclosure 12 and circuit card assembly 14. Then, a cover (not shown) can be installed on card guided computer enclosure 12, opposite of motherboard 20.

Removable tools 18 can also be used to extract circuit card assembly 14 from card guided computer enclosure 12. To do so, each removable tool 18 is positioned such that toe 34 is in enclosure notch 26 and clevis 36 is in card hook 32. Then force is exerted onto handle 38 along extraction direction 42 (which occurs substantially simultaneously for both removable tools 18). Because enclosure notch 26 constrains toe 34, there is a resulting force on card hook 32 that urges circuit card assembly 14 away from motherboard 20. If the force is sufficient, card contact arrays 28 will overcome the friction force of motherboard contact arrays 22 and circuit card assembly 14 will be extracted from card guided computer enclosure 12. Once this occurs, removable tools 18 are removed from card guided computer enclosure 12 and circuit card assembly 14, and circuit card assembly 14 can be slid out from between card guides 24. A cover (not shown) can not be installed over enclosure 12 and circuit card assembly 14 with removable tools 18 still in place. This prevents removable tools 18 from being left inside computer 10 after insertion of circuit card assembly 14.

The components and configuration of computer 10 allow for circuit card assembly 14 to be inserted into and extracted from card guided computer enclosure 12 with minimal effort by the assembler. This is because the leverage ratio of the lever is at least 4:1, with the illustrated embodiment depicting a 5:1 radio. In addition, handle 38 is angled upward when in use, which provides the user with clearance for his or her fingers to exert force on handle 38. Also, the cover (not shown) cannot be installed with removable tool 18 still in place, which prevents removable tool 18 from being left inside computer 10 after insertion of circuit card assembly 14.

In the embodiment shown in FIGS. 1A-1C, a unitary card frame 30 is shown. Such an arrangement provides stiffness for circuit card assembly 14. Although for the purposes of the present invention, there can be two card frames 30 with each card frame having its own clevis 36.

Figure 2A:
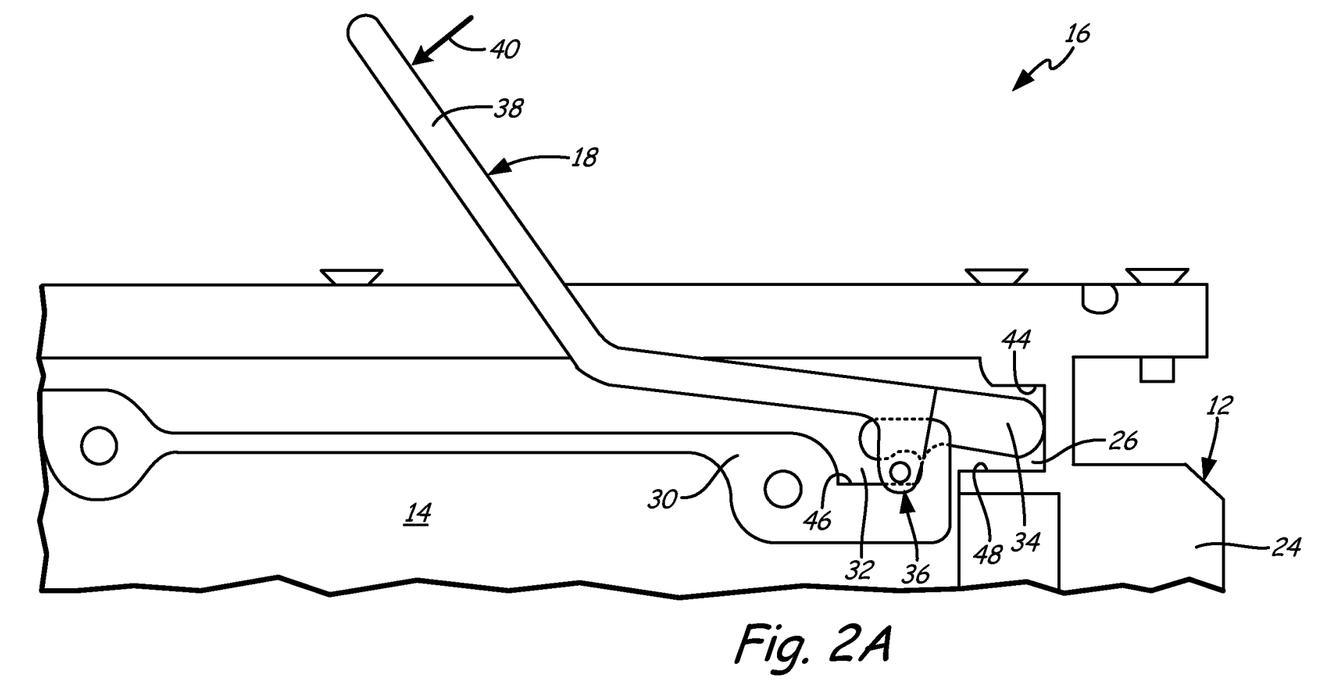
FIG. 2A is a front view of the leverage arrangement during insertion of the circuit card assembly.

In FIG. 2A, a front view of leverage arrangement 16 during insertion of circuit card assembly 12 is shown. Leverage arrangement 16 is as described previously in FIGS. 1A-1C with additional details provided. For example, enclosure notch 26 includes notch top 44, and card hook 32 includes hook bottom 46.

When removable tool 18 has toe 34 positioned in enclosure notch 26, clevis 36 positioned in card hook 32, and force applied in insertion direction 40, toe 34 contacts notch top 44 and clevis 36 contacts hook bottom 46. Notch top 44 constrains the movement of toe 34, which results in a force applied by clevis 36 onto hook bottom 46. This causes circuit card assembly 14 to be inserted into card guided computer enclosure 12.

Figure 2B:
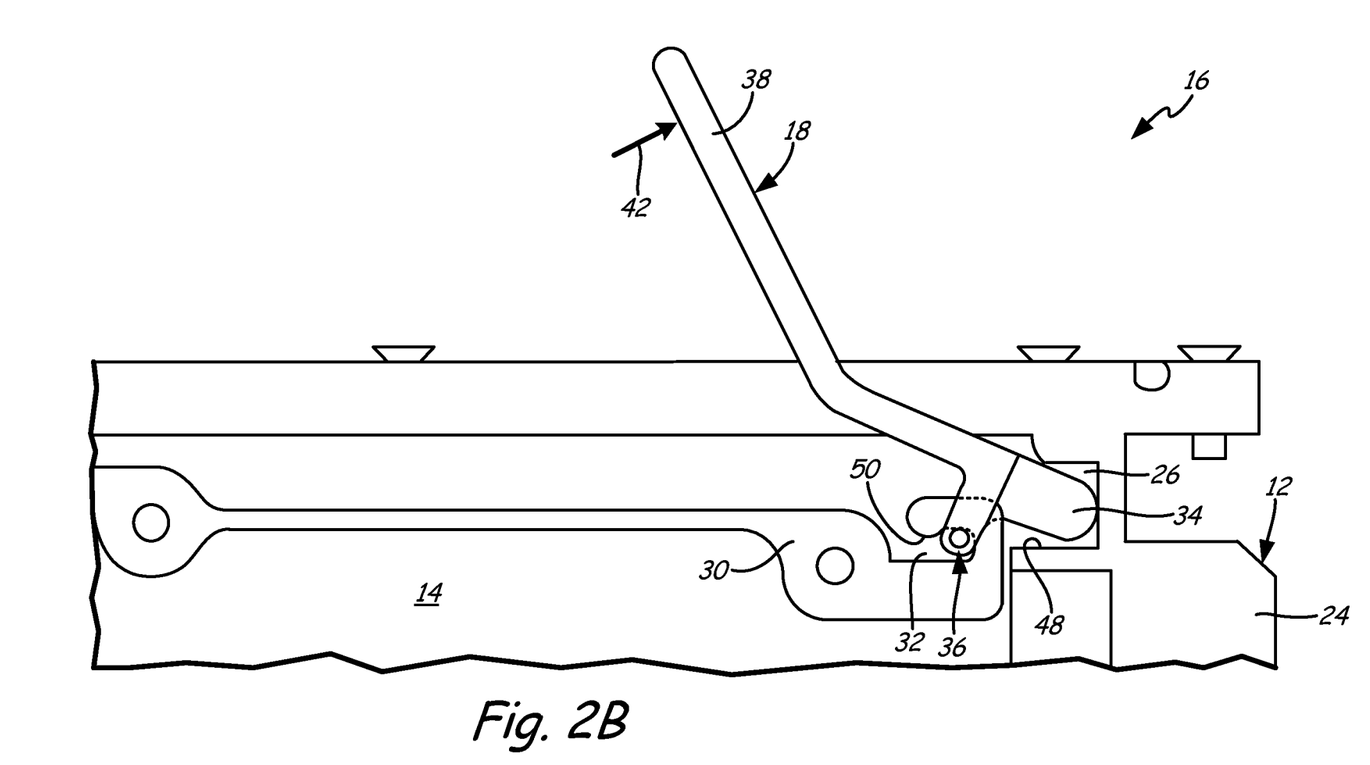
FIG. 2B is a front view of the leverage arrangement during extraction of the circuit card assembly.

In addition, in FIG. 2B, a front view of leverage arrangement 16 during extraction of circuit card assembly 12 is shown. Leverage arrangement 16 is as described previously in FIGS. 1A-1C with additional details provided. For example, enclosure notch 26 includes notch bottom 48, and card hook 32 includes hook top 50. When combined with the details provided in FIG. 2A, enclosure notch 26 is a C-shaped feature while card hook 32 is a hook-shaped feature.

When removable tool 18 has toe 34 positioned in enclosure notch 26, clevis 36 positioned in card hook 32, and force applied in extraction direction 42, toe 34 contacts notch bottom 48 and clevis 36 contacts hook top 50. Notch bottom 48 constrains the movement of toe 34, which results in a force applied by clevis 36 onto hook top 50. This causes circuit card assembly 14 to be extracted from card guided computer enclosure 12.

The components and configuration of leverage arrangement 16 allow for circuit card assembly 14 to be inserted into or extracted from card guided computer enclosure 12 using less force than if removable tool 18 was not used. This is because, as stated earlier, removable tool 18 acts as a lever. Because toe 34 is much closer to clevis 36 than handle 38 is to clevis 36, removable tool 18 provides at least a 4:1 leverage ratio (for example, a 5:1 leverage ratio is depicted).

Figure 3A:
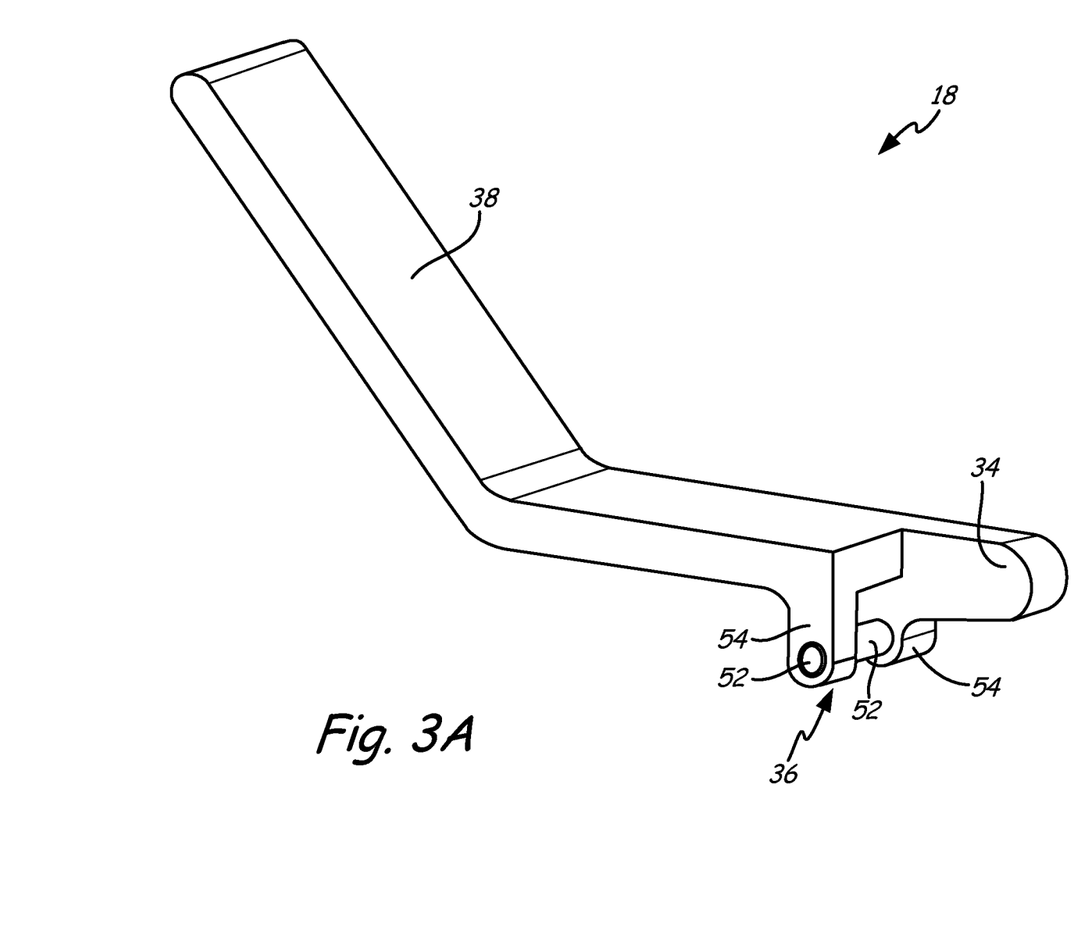
FIG. 3A is a perspective view of the removable tool.

In FIG. 3A, a perspective view of removable tool 18 is shown. As stated previously, toe 34 is at one end of removable tool 18 and handle 38 is at the opposite end. Between these two features is clevis 36. In the illustrated embodiment, toe 34 is a rounded end of removable tool 18. In addition, clevis 36 includes pin 52 that is supported by legs 54. The configuration of removable tool 18 allows for clevis 36 to pass through card frame 30. In addition, their round shapes allow for toe 34 and pin 52 to slide along notch top 44 and hook bottom 46, respectively (during insertion as shown in FIG. 2A), and for toe 34 and pin 52 to slide along notch bottom 48 and hook top 50, respectively (during extraction as shown in FIG. 2B).

Figure 3B:
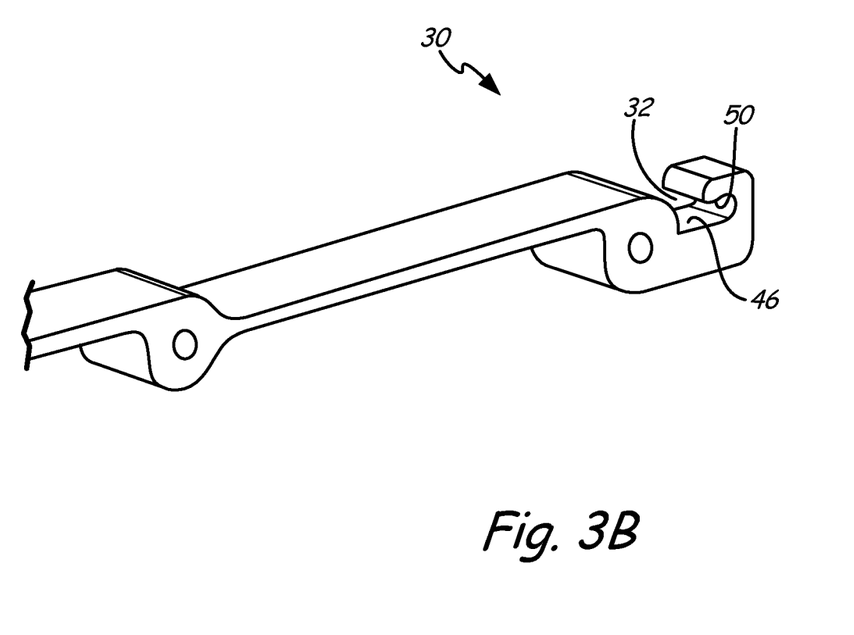
FIG. 3B is a perspective view of a card frame including a clevis.

In FIG. 3B, a perspective view of card frame 30 including card hook 32 is shown. As stated previously, card hook 32 as defined by card frame 30 has a hook-shape with hook top 50 and hook bottom 46. More specifically, hook top 50 is a curved surface that turns toward hook bottom 46 at the free end of hook top 50. This configuration of card frame 30 allows for clevis 36 to maintain contact with card frame 30 longer during extraction (as shown in FIG. 2B).

The present invention provides various benefits and advantages. For example, removable tool 18 does not stay with computer 10, which reduces the weight of computer 10. For another example, two removable tools 18 can be used to insert and/or extract many different circuit card assemblies 14, so having two removable tools 18 for every circuit card assembly 14 is not necessary. This reduces the cost of computer 10.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A computer comprising:
   a card guided computer enclosure including a first enclosure notch on a first enclosure side of the card guided computer enclosure and a second enclosure notch on an opposite side of the card guided computer enclosure, each enclosure notch being configured to receive a removable tool from a secondary direction; and
   a circuit card assembly positioned in the card guided computer enclosure, the circuit card assembly including a first card hook on a first card side of the circuit card assembly and a second card hook on an opposite side of the circuit card assembly, the first card hook being configured to receive the removable tool from the secondary direction such that the removable tool transmits a force to the first enclosure notch, the force being transmittable to the first card hook, such that the force on the first card hook urges the circuit card assembly into or out of the card guided computer enclosure in a primary direction;

wherein the first enclosure notch is adjacent to the first card hook and the second enclosure notch is adjacent to the second card hook.

2. The computer of claim 1, and further comprising:
a frame attached to the circuit card assembly;
wherein each card hook is defined by the frame.

3. The computer of claim 1, wherein each card hook is a hook-shaped portion of the circuit card assembly.

4. The computer of claim 1, wherein each enclosure notch is a C-shaped portion of the card guided computer enclosure.

5. A method of inserting a circuit card assembly into a card guided computer enclosure, the method comprising:
 positioning the circuit card assembly into the card guided computer enclosure;
 positioning a toe of a first removable tool into an enclosure notch on the card guided computer enclosure and positioning a clevis of the first removable tool into a card hook on the circuit card assembly;
 exerting a first force on the first removable tool, while maintaining the toe in the enclosure notch and the clevis in the card hook, moving the first removable tool and the circuit card assembly in a primary direction until an array of card contacts are inserted into an array of motherboard contacts;
 moving the first removable tool in a secondary direction that is generally perpendicular to the primary direction to remove the toe from the enclosure notch and to remove the clevis from the card hook; and
 removing the first removable tool from the card guided computer enclosure and the circuit card assembly.

6. The method of claim 5, and further comprising:
installing a cover onto the card guided computer enclosure.

7. The method of claim 5, wherein a second force is exerted upon two a second removable tool substantially simultaneously with the first force being exerted on the first removable tool to insert the array of card contacts into the array of motherboard contacts.

8. The method of claim 5, and further comprising extracting the circuit card assembly from the card guided computer enclosure by:
 positioning the toe of the first removable tool into the enclosure notch on the card guided computer enclosure and positioning the clevis of the first removable tool into the card hook on the circuit card assembly a second time;
 exerting a third force on the first removable tool, while maintaining the toe in the enclosure notch and the clevis in the card hook, moving the first removable tool and the circuit card assembly in the primary direction until the array of card contacts are extracted from the array of motherboard contacts;
 moving the first removable tool in the secondary direction to remove the toe from the enclosure notch and to remove the clevis from the card hook;
 removing the first removable tool from the card guided computer enclosure and the circuit card assembly; and
 extracting the circuit card assembly from the card guided computer enclosure.

9. The method of claim 8, wherein a fourth force is exerted upon a second removable tool substantially simultaneously with the third force being exerted on the first removable tool to extract the array of card contacts from the array of motherboard contacts.

10. The method of claim 5, wherein the first removable tool is configured to prevent covering the enclosure and the circuit card assembly before removing the first removable tool from the enclosure and the circuit card assembly.

\* \* \* \* \*

UNITED STATES PATENT AND TRADEMARK OFFICE
CERTIFICATE OF CORRECTION

| | |
|---|---|
| PATENT NO. | : 8,902,601 B2 |
| APPLICATION NO. | : 13/470904 |
| DATED | : December 2, 2014 |
| INVENTOR(S) | : Kenneth J. Trotman and Michael Maynard |

It is certified that error appears in the above-identified patent and that said Letters Patent is hereby corrected as shown below:

In the Claims

Col. 6, Line 2, Claim 7,
  Delete "two" after "upon"

Signed and Sealed this
Fourteenth Day of April, 2015

Michelle K. Lee
*Director of the United States Patent and Trademark Office*